United States Patent
Latham et al.

[19]

[11] Patent Number: 5,952,945
[45] Date of Patent: Sep. 14, 1999

[54] DIGITAL/ANALOGUE CONVERSION

[75] Inventors: Nicholas Hugh James Latham, Hertfordshire; Christopher John Reed, Essex; John McNicol, Devon, all of United Kingdom

[73] Assignee: Northern Telecom Limited, Montreal, Canada

[21] Appl. No.: 08/911,191

[22] Filed: Aug. 14, 1997

[51] Int. Cl.[6] ................................................. H03M 1/20
[52] U.S. Cl. ........................................... 341/131; 341/144
[58] Field of Search .................................... 341/131, 118, 341/130, 138, 139, 140, 143, 144

[56] References Cited

U.S. PATENT DOCUMENTS 4,994,803   2/1991   Blackham ................................. 341/131

*Primary Examiner*—Brian Young
*Attorney, Agent, or Firm*—Chapman and Cutler

[57] ABSTRACT

Method and apparatus of converting between digital and analogue signal formats, wherein dither signals are combined with information signals to be converted, the dither signals being as a predetermined plurality of particular discrete frequencies that are outside desired information signal bandwidth and have orderly relation including to signal conversion sampling rate, which orderly relation aids looping of sequences of patterns in a related data stream having pattern-to-pattern transitions similar to within-pattern transitions. Specifically, discrete dither signal frequencies have integral relation with their minimum separation or spacing and with said sampling rate, the lowest frequency and the minimum frequency separation each being whole number divisors or submultiples of higher dither frequencies andor of the signal conversion rate.

28 Claims, 4 Drawing Sheets

DIGITAL/ANALOGUE CONVERSION

FIELD OF THE INVENTION

This invention relates to method and means for conversion of electrical signals between digital and analogue formats.

BACKGROUND TO THE INVENTION whether in relation to radio communication or otherwise, it is well known that information signals quantised at and relative to discrete levels or values characteristic of digital signals can, as compared with desirably smoothly continuously changing analogue signals, experience or cause problems by way of generating spurious signal components, often due to inevitable imperfections of manufacture, say if discrete levels are not exactly of ideal equal size and/or some degree of non-linear transfer function is involved; and that addition of so-called "dither" signals can be useful in combatting such problems, perhaps particularly in achieving and maintaining satisfactory differences between levels of wanted information signal content and unwanted spurious signal content. There have been many proposals concerning the nature of dither signals, typically involving frequencies below those of interest as information signals, and ranging from a so-called "white noise", usually with steep filter as particularly for analogue-to-digital signal conversion; to output of pseudo-random number generators, at least for digital-to-analogue signal conversion.

It is the case that pseudo-random number generation, at least for digital-to-analogue signal conversion, can result in problems if related necessarily looped patterns of data stream constituting successive dither signals contain undue phase and/or amplitude discontinuities, including between first and last samples of looping sequences of patterns. Such requirements can be difficult and/or costly to implement and achieve, whether by hardware which tends to be highly specialized in terms of being inflexibly specific to particular applications, or by software which may have a greater departure than some hardware pseudo-random number generators from approach to true randomness. As will be apparent, all systems using pseudo-random generators, whether software or hardware based, are essentially compromises inescapably actually involving rather careful "control" of true "randomness".

SUMMARY OF THE INVENTION

It is an object of this invention to take a different approach that is readily made less prone to the sort of problems discussed above, According to one aspect of this invention, dither signals for use in conversion between digital and analogue signal formats comprise or are limited to a predetermined plurality of particular discrete frequencies, outside desired information signal bandwidth and with orderly relation including to signal conversion sampling rate.

Predetermined particular discrete dither signal frequencies can readily have orderly nature to assure improved at least relatively satisfactory aforesaid looping of sequences of patterns in related data stream, i.e. avoiding content representing or leading to undue phase and/or amplitude discontinuities and consequent unwanted harmonic effects. A suitable orderly integral nature can be provided by way of minimum separation or spacing of discrete frequencies of dither signal being a whole number divisor or submultiple for those dither frequencies and further for the signal conversion rate concerned, other separations or spacings of discrete dither frequencies being permissible if multiples of said minimum. Said minimum separation can be equal to lowest of discrete dither frequencies, or of lesser integral submultiple nature. All of the discrete dither frequencies are conveniently, as a set, equally spaced; and/or can be present together. Randomness in the time domain is readily achieved relative to starting phases of the component dither frequency signals, say using a suitable pseudo-random basis, whether of a hardware generator or (usually more conveniently and advantageously) a software nature, say to result in a look-up table of loopable data words or numbers usually stored in computer memory, whether of readily readable-writable random-access (RAM) type or programmable read-only (PROM) or erasable and rewritable (EPROM, EEPROM) types etc.

The combined power of the composite component dither frequency signals can be much less than full scale analogue information signals of interest, which ensures that headroom loss is minimal. Whilst not to be taken as more than by way of example and subject to change is justified by routine further investigations, good results have been achieved using dither signal power levels at 4 decibels above what would nominally produce zero headroom if all component dither signals happened to be in phase at maxima, an impractical proposition given preferred randomising of start phases.

Practical embodiments of this invention can be based on one particular sine wave digitisation or basic frequency source and variable or plural multiplying or dividing steps or stages in order to generate or select a working set of discrete dither frequency signals. Such a system should, of course, have its discrete dither signal frequencies only outside the frequency range of interest for information signals concerned, typically below following known prior practice, but without apparent reason not to consider and use frequencies above such range, feasibly with advantage.

For satisfactory performance, the number of available discrete dither signal components will depend on particular applications and performance desiderata. Spacing between, or separation, of frequencies of the component dither frequency signals allows control of the length of dither signal patterns required, and determines the bandwidth of the composite dither signal. Exemplary minimum spacing/separation of 5 KHz and limiting to a dither signal bandwidth of about 1 MHz allows for up to about two hundred tones of dither at frequency at equal spacings as has proved satisfactory in a digital-to-analogue converter operating at a 32 MHz information signal bandwidth and/or 64 Megasamples per second sampling rate, conveniently at a power down by about 50 decibels on full-sale message power output, leading to a highly satisfactory so-called spurious-free dynamic range.

BRIEF DESCRIPTION OF THE DRAWINGS

Specific implementation for this invention will now be described, by way of example, with reference to the accompanying diagrammatic drawings, in which.

DESCRIPTION OF PREFERRED EMBODIMENTS

Figure 1A:
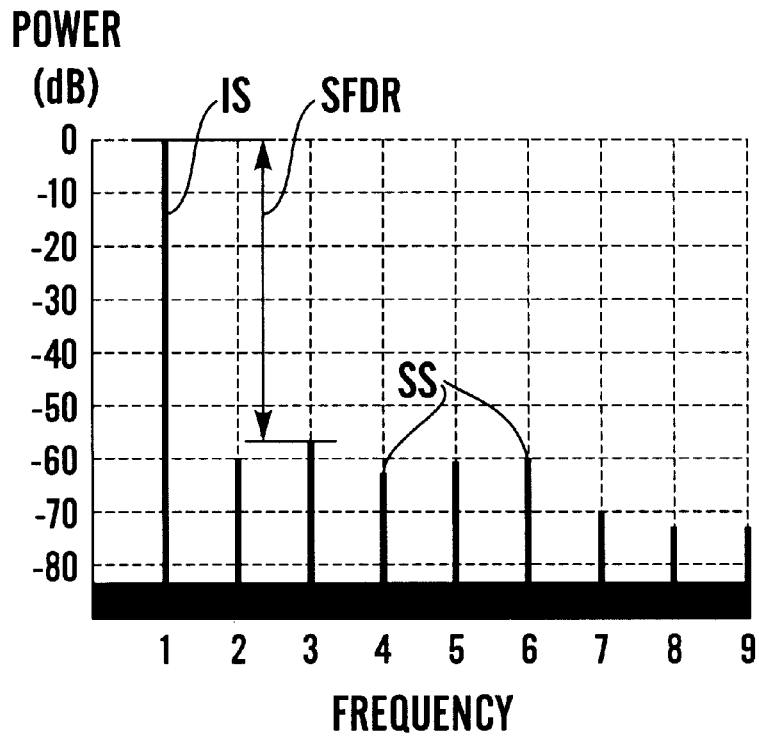
FIGS. 1A, 1B and 2 are idealized graphical representations of frequency plots without and with application of dither.
Figure 1B:
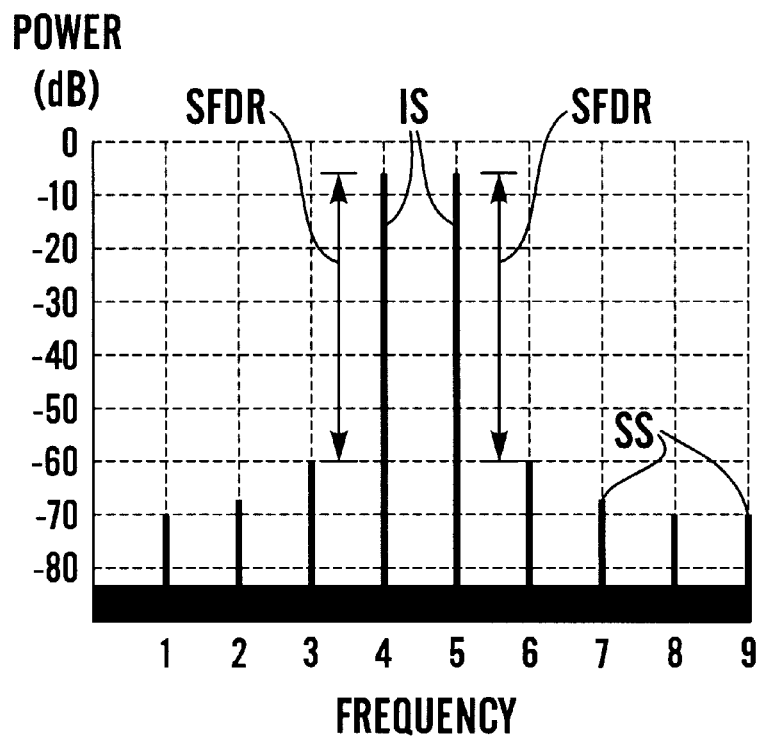
Figure 2:
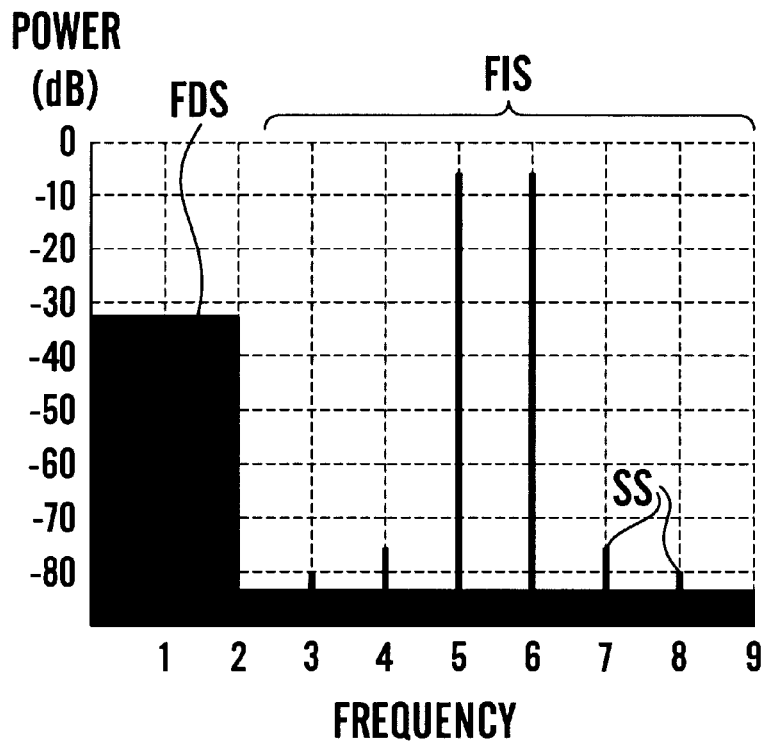

FIG. 1A shows possible spurious signal components by way of harmonics of a single frequency and FIG. 1B shows possible spurious signals components by way of intermodulation products of two frequencies. In each case, the so-called spurious-free dynamic range (SFDR) is indicated, basically as difference in amplitude between information signals of interest (IS) and largest of spurious signals (SS). FIG. 2 shows in-principle beneficial effects of using randomised dither signals in a frequency range FDS below the information signal frequencies of interest in band FIS. Substantial improvement in the spurious-free dynamic range will be noted.

Figure 3:
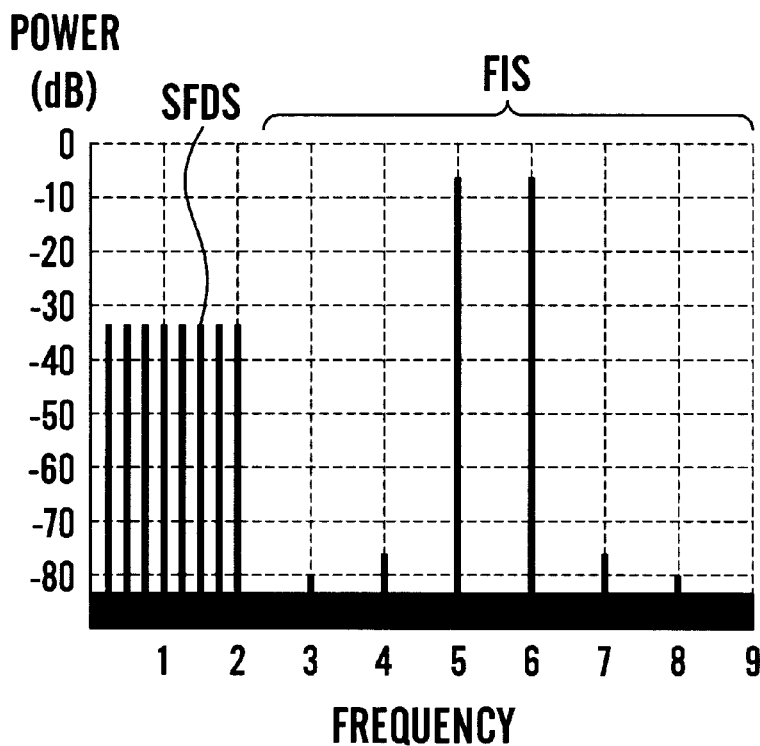
FIG. 3 is an idealised graphical representation of a frequency plot relevant to embodying this invention.

Turning to FIG. 3, similar improvement is indicated effectively by use of a particular sub-set of the random dither range FDS of FIG. 2, specifically and practically advantageously a prescribed set of frequencies and spacings thereof, for which there is whole-number or integral divisor/sub-multiple relationship of spacings to dither frequencies and to sampling rate of quantisation of digital signals in the system concerned and to information frequency of transmission, where significant. Each dither signal can, conveniently and preferably does, contain all component dither frequencies of the prescribed set with each component dither frequency having the same amplitude and average power but a pseudo-randomised start phase.

Figure 4A:
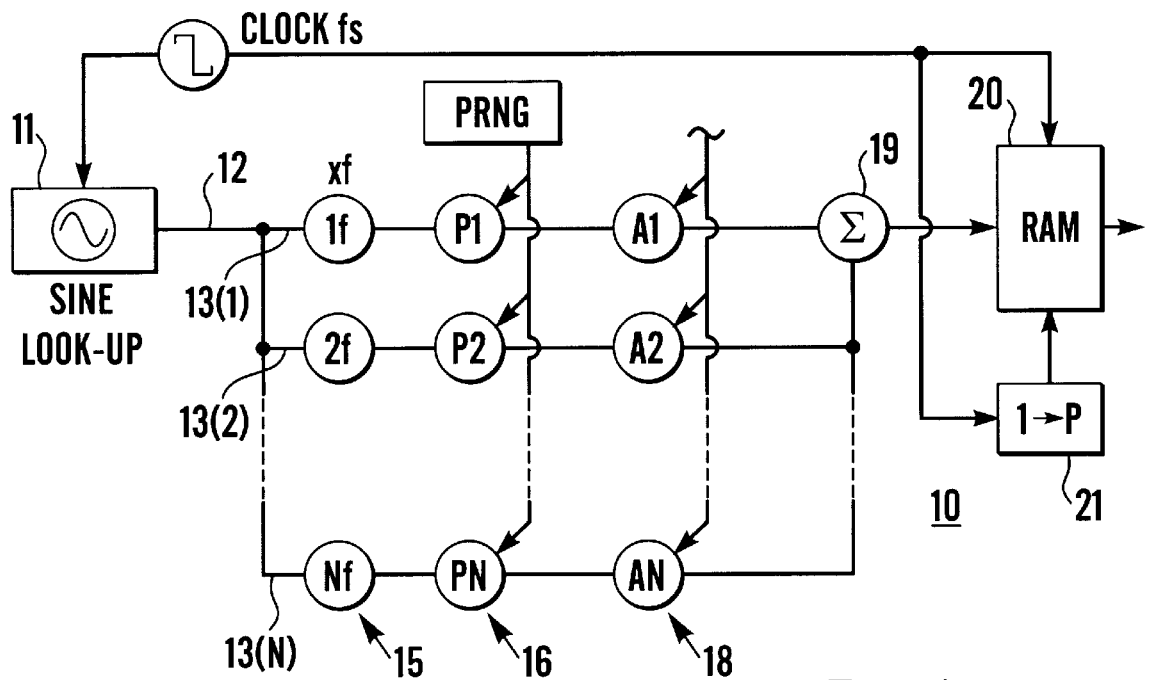
FIG. 4A is a block circuit diagram showing hardware generation of discrete frequency dither hereof to afford look-up data for looped recovery from memory in application to an input signal for digital-to-analogue conversion.

FIG. 4A shows, in functional block diagram outline only, hardware generation 10 of digital dither signals as a satisfactorily loopable data stream pattern derived from data representing a basic frequency source 11, specifically a pure sine wave look-up table store, with output 12 shown going via branches 13 to plural integral number frequency multiplying circuits 15(1f)–15(Nf) with respective associated start phase-determination at 16(Pl)–16(PN) typically operative on a pseudo-random number basis such as according to output (s) from a random number generator 17. It will, of course, be appreciated that component frequency derivation could as well, or even preferably, be by division from a high frequency source, say crystal clock. Outputs from the multiplying and start-phase adjusting mens 15 and 16 are shown going to signal adding or combining circuit 19 shown to cumulate dither frequency components onto each other in providing desired composite dither signals on output for storing in memory 20. Those start-phase adjusted outputs are shown as though for more general applications hereof further going via amplitude adjustment means 18 (Al)–18 (AN). Specification of start phases can be with differences as fine as desired, say as 32-bit pseudo-random numbers specifying fractions of 360°.

It will also be appreciated that no actual sine wave signal source is ever required as the trigonometric wave-form function concerned is readily calculable, particularly by computer directly into binary digital form, ad readily available at any desired resolution (thus to match any effective maximum sampling rate). Moreover, it will be further appreciated that the entirety of operations of or equivalent to indications at 13–19, including 18 (where needed), can readily be provided, say as shift-based and/or addition operations, by program-controlled computer, including of microprocessor or PC type, thus be available for loading into store, whether or not wholly, partially or at all, produced locally to the digital-to-analogue conversion involved for any particular purpose.

FIG. 4A indicates simplest set of component dither frequencies as sequential multiples of separation or spacing fD that will also be a whole number divisor or submultiple for sampling rate for digital-to-analogue conversion, in this case actually equal to the lowest dither frequency thus satisfying whole number sampling rate divisor requirements for that also. Every dither frequency will have an integral number of cycles over an interval corresponding to a stored data pattern and consecutive number of samples representing a minimum population of a loopable data stream thus to appear as repetitions of said pattern as stored in the memory 20. Such minimum pattern length or store population P will be the higher of the ratios of sampling rate to minimum dither frequency spacing or to lowest dither frequency.

The number of dither frequencies or tones in desired orderly relation and closeness of their spacings determines closeness of approximation to band-limited truly random noise. Our development tests used 200 tones at 5 KHz spacings in a 1 MHz dither bandwidth in order satisfactorily to "spread" otherwise intrusive spurious harmonic effects. For some applications lesser number and/or bandwidth may be satisfactory, though more might be used in others.

It is to be understood that "live" dither generation hardware could be used, say performing operations on an on-line basis progressively from machine cycle to machine cycle rather than storing in memory and simply to be looked up, much though the laster tends to have been preferred in practical models to date.

Figure 4B:
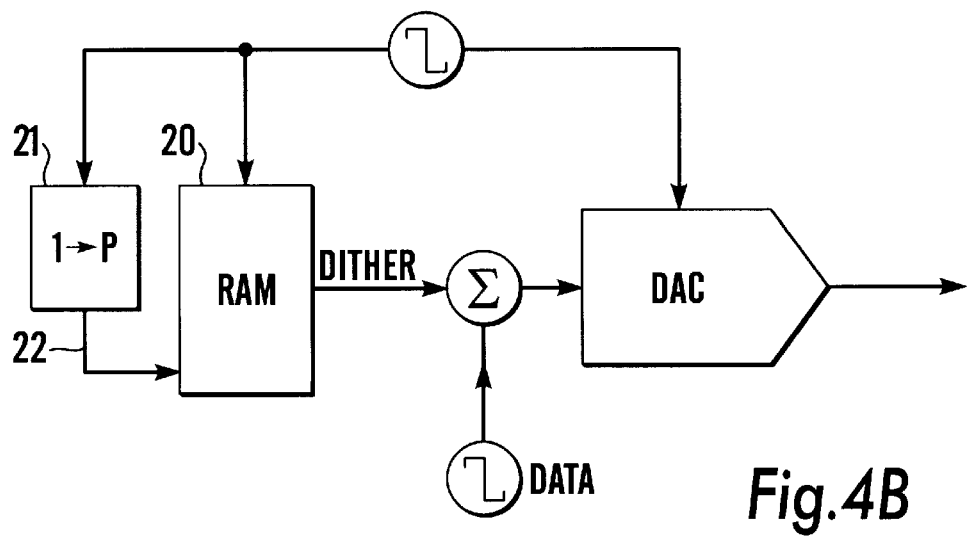
FIG. 4B is a block circuit diagram of application digital-to-analogue (DAC) conversion.

FIGS. 4A and 4B both show looping by means of a store addressing counter 21 that can be clocked at desired digital-to-analogue sampling rate fS and have a capacity P corresponding to said pattern and an overflow-to-zero manner of operation for addressing at 22 and reading out the above-mentioned pattern repeating data stream from the store 20 as composite dither data signals at 24 going to combining circuit 25 also shown receiving information signals on output 26 from digital data signal source 27.

Figure 5:
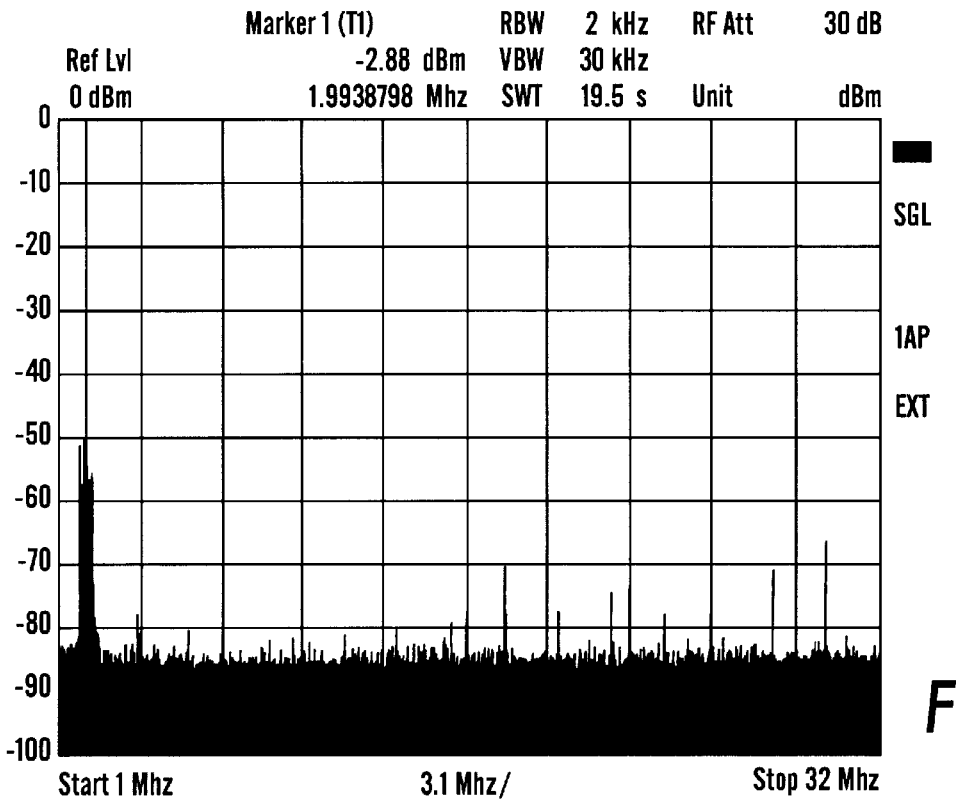
FIGS. 5 and 6 are graphs showing beneficial effects of dither hereof relative to otherwise likely unwanted spurious signal components.
Figure 6:
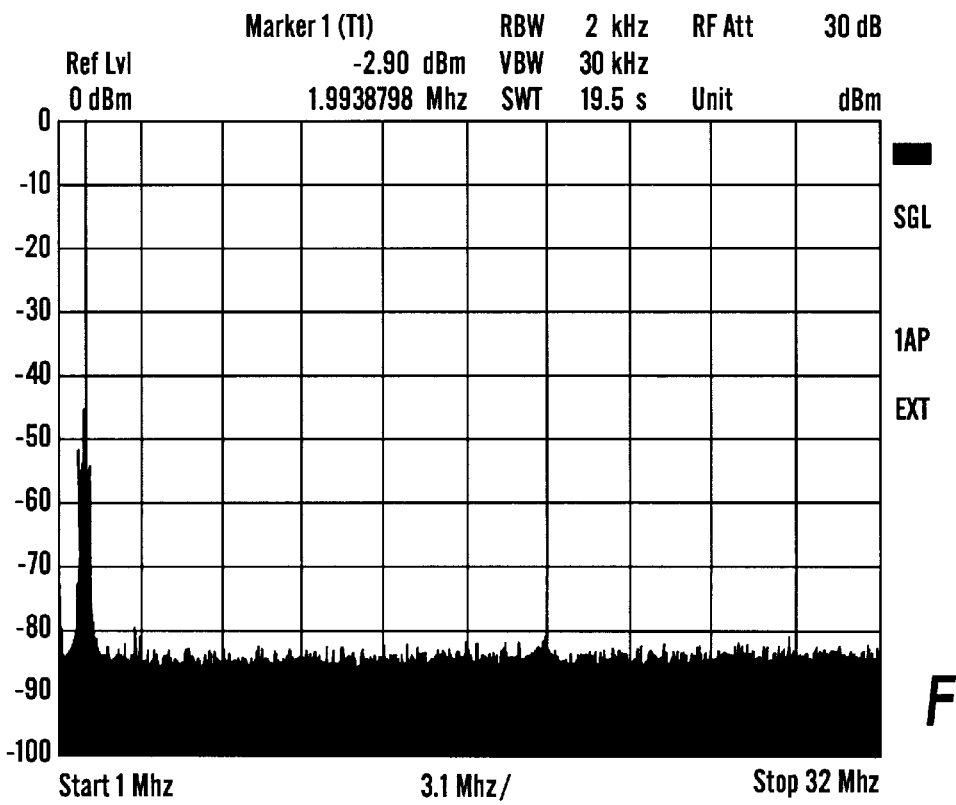

Practical effects, or reasonable simulations thereof, are indicated in FIG. 6 as compared with FIG. 5. Many more larger spurious signal spikes are visible in FIG. 5, corresponding to absence of dither provision hereof, than the much more orderly and lower amplitude spreading of non-information signal content in FIG. 6 corresponding to presence of specific frequency dither signals hereof.

Above specific description ad drawings for digital-to-analogue conversion reflects the way that in-principle benefits of application of dither hereof to analogue signals to be converted to digital for face practicality of analogue "white" noise sources and steep filters being much cheaper than also relatively inflexible implementation utilising analogue generation of multiple sine waves likely to require filtering before being fed to analogue summing circuitry also receiving analogue information signal (s) prior to being converted to digital form; and/or than using digital look-up table or the like sourcing of multiple dither sine waves for read out and summing at sampling rate for digital-to-analogue conversion before summing with analogue information signal (s) as combined input to the analogue-to-digital converter as such, particularly as the DAC stage would need a noise and spurious-free dynamic range performance better by at least about 3 dB than the ADC stage.

We claim:

1. Apparatus for conversion between digital and analogue signal formats, including means for combining dither signals with information signals to be converted, and means for producing said dither signals as a predetermined plurality of particular discrete frequencies that are outside desired information signal bandwidth and have orderly relation including to signal conversion sampling rate.

2. Apparatus according to claim 1, wherein said discrete dither signal frequencies have orderly nature that aids looping of sequences of patters in a related data stream having pattern-to-pattern transitions similar to within-pattern transitions.

3. Apparatus according to claim 1, wherein said discrete dither signal frequencies have integral relation with their minimum separation or spacing.

4. Apparatus according to claim 1, wherein said discrete dither signal frequencies have integral relation of their minimum separation or spacing with said sampling rate.

5. Apparatus according to claim 1, wherein said discrete dither signal frequencies have both of lowest frequency and minimum frequency separation that are each whole number divisors or submultiples for those dither frequencies and further for the signal conversion rate concerned.

6. Apparatus according to claim 1, wherein lowest of said discrete dither signal frequencies is equal to minimum frequency separation of said discrete dither frequencies.

7. Apparatus according to claim 1, wherein all of said discrete dither signal frequencies are present together at each sampling.

8. Apparatus according to claim 1, wherein said discrete dither signal frequencies have randomness in the time domain by reason of their starting phases being different on a pseudo-random basis.

9. Apparatus according to claim 1, wherein said discrete dither signal frequencies constitute signal components of substantially the same amplitude and average power.

10. Apparatus according to claim 1, wherein combined power of said dither frequency signals is much less than full scale analogue information signals of interest.

11. Apparatus according to claim 1, wherein dither signal power levels are at about 4 dB above what would nominally produce zero headroom if all component dither signals happened to be in-phase at maxima.

12. Apparatus according to claim 1, wherein said discrete dither signal frequencies are below the frequency range for information signals of interest.

13. Apparatus according to claim 1, wherein said discrete dither signal frequencies have a minimum spacing/separation of 5 KHz in a dither signal bandwidth of about 1 MHz.

14. Apparatus according to claim 1, including digital store means for summations of said discrete dither signal frequencies, and store reading means for providing repeating patterns of said store contents.

15. Method of converting between digital and analogue signal formats, the method utilising combining of dither signals with information signals to be converted, the dither signals being as a predetermined plurality of particular discrete frequencies that are outside desired information signal bandwidth and have orderly relation including to signal conversion sampling rate.

16. Method according to claim 15, wherein said discrete dither signal frequencies have orderly nature that aids looping of sequences of patterns in a related data stream having pattern-to-pattern transitions similar to within-pattern transitions.

17. Method according to claim 15, wherein said discrete dither signal frequencies have integral relation with their minimum separation or spacing.

18. Method according to claim 15, wherein said discrete dither signal frequencies have Integral relation of their minimum separation or spacing with said sampling rate.

19. Method according to claim 15, wherein said discrete dither signal frequencies have both of lowest frequency and minimum frequency separation that are each whole number divisors or submultiples for those dither frequencies and further for the signal conversion rate concerned.

20. Method according to claim 15, wherein lowest of said discrete dither signal frequencies is equal to minimum frequency separation of said discrete dither frequencies.

21. Method according to claim 15, wherein all of said discrete dither signal frequencies are present together at each sampling.

22. Method according to claim 15, wherein said discrete dither signal frequencies have randomness in the time domain by reason of their starting phases being different on a pseudo-random basis.

23. Method according to claim 15, wherein said discrete dither signal frequencies constitute signal components of substantially the same amplitude and average power.

24. Method according to claim 15, wherein combined power of said dither frequency signals is much less than full scale analogue information signals of interest.

25. Method according to claim 15, wherein dither signal power levels are at about 4 dB above what would nominally produce zero headroom if all component dither signals happened to be in-phase at maxima.

26. Method according to claim 15, wherein said discrete dither signal frequencies are below the frequency range for information signals of interest.

27. Method according to claim 15, wherein said discrete dither signal frequencies have a minimum spacing/separation of 5 KHz in a dither signal bandwidth of about 1 MHz.

28. Method according to claim 15, wherein igital store means are used for summations of said discrete dither signal frequencies, and store reading means for providing repeating patterns of said store contents.

* * * * *